US008954806B2

(12) United States Patent
Dan et al.

(10) Patent No.: US 8,954,806 B2
(45) Date of Patent: Feb. 10, 2015

(54) SINGLE EVENT-UPSET CONTROLLER WRAPPER THAT FACILITATES FAULT INJECTION

(75) Inventors: Yie-Fong Dan, Cupertino, CA (US); Shi-Jie Wen, Sunnyvale, CA (US); Raymond Ng, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 771 days.

(21) Appl. No.: 12/962,417

(22) Filed: Dec. 7, 2010

(65) Prior Publication Data
US 2012/0144244 A1    Jun. 7, 2012

(51) Int. Cl.
G06F 11/00    (2006.01)
G06F 11/24    (2006.01)
G11C 29/10    (2006.01)
(Continued)

(52) U.S. Cl.
CPC ............... G06F 11/24 (2013.01); G11C 29/10 (2013.01); G11C 29/56 (2013.01); G11C 2029/5002 (2013.01)
USPC .............................................. 714/41; 714/42

(58) Field of Classification Search
CPC ............ G01R 31/2815; G01R 31/31816; G01R 31/318519; G06F 11/2215; G06F 11/2221; G06F 11/27; H04L 43/0852; H04L 43/0829; H04L 43/08; H04L 43/0823
See application file for complete search history.

(56) References Cited

U.S. PATENT DOCUMENTS 5,668,816 A * 9/1997 Douskey et al. ............... 714/720
6,539,503 B1 * 3/2003 Walker .......................... 714/703
(Continued)

OTHER PUBLICATIONS

Floering, B.; Brothers, B.; Kalbarczyk, Z.; Iyer, R., "An adaptive architecture for monitoring and failure analysis of high-speed networks," Dependable Systems and Networks, 2002. DSN 2002. Proceedings. International Conference on , vol., no., pp. 69,78, 2002.*

(Continued)

Primary Examiner — Scott Baderman
Assistant Examiner — Jason Bryan
(74) Attorney, Agent, or Firm — Brinks Gilson & Lione

(57) ABSTRACT

A method that determines the system impact of single event upset (SEU) and a single event upset (SEU) wrapper that controls a SEU controller is disclosed. The method injects faults into a component (e.g. FPGA, ASIC) of an operational system that is carrying live traffic and monitors the system's response to the faults to determine the impact of SEU on the system. The SEU wrapper sends the SEU controller a pattern scheme that includes information indicating when, where, how often, and/or how long to inject bursts of one or more faults into memory of the component of the system. A burst of faults contains faults that are consecutively injected into the array of memory blocks. After each fault in a burst is injected, one or more errors in one or more memory elements are detected and/or corrected. Information regarding the detection and/or the correction of an error is updated using registers that store counters. After injecting a burst of faults, the SEU controller waits for a predetermined amount of time. While waiting for a predetermined amount of time, the system monitors the system response to the burst of faults, such as monitoring the system for failures. After waiting, the SEU controller determines whether to inject another burst of faults. Bursts of faults are injected into the plurality of memory blocks until a system failure is detected or until the pattern scheme indicates to no longer inject bursts of faults into the memory.

23 Claims, 6 Drawing Sheets

(51) Int. Cl.
G11C 29/56 (2006.01)
G11C 29/50 (2006.01)

(56) References Cited

U.S. PATENT DOCUMENTS

| | | | |
|---|---|---|---|
| 6,886,116 B1* | 4/2005 | MacLellan et al. | 714/703 |
| 2006/0277444 A1* | 12/2006 | Holian et al. | 714/41 |
| 2007/0208977 A1* | 9/2007 | Clark et al. | 714/728 |
| 2009/0164846 A1* | 6/2009 | Foster et al. | 714/30 |
| 2010/0163756 A1* | 7/2010 | McPeak | 250/492.21 |
| 2012/0084628 A1* | 4/2012 | Cox et al. | 714/763 |

OTHER PUBLICATIONS

A. Benso, S. di Carto, G. di Natale, and P. Prinetto. 2001. SEU effect analysis in an open-source router via a distributed fault injection environment. In Proceedings of the conference on Design, automation and test in Europe (Date '01), Wolfgang Nebel and Ahmed Jerraya (Eds.). IEEE Press, Piscataway, NJ, USA, 219-225.*

Bridgford, Brendan et al., "*Single-Event Upset Mitigation Selection Guide*", Xilinx XAPP987 (v1.0) Mar. 18, 2008 (7 pages).

* cited by examiner

SINGLE EVENT-UPSET CONTROLLER WRAPPER THAT FACILITATES FAULT INJECTION

TECHNICAL FIELD

The present disclosure generally relates to electronic circuits and, more particularly, to injecting faults into an electronic circuit and/or systems having multiple electronic circuits to determine the response of the circuit and/or system when subjected to errors.

BACKGROUND

A single event upset (SEU) is a change of state caused by alpha particles, neutrons, ions or electro-magnetic radiation in an electronic device, such as a chip or an integrated circuit. The integrated circuit may be a field-programmable gate array (FPGA) or an application-specific integrated circuit (ASIC). The electronic device may be part of a larger system. For example, the system may include several chips or integrated circuits. The change of state may affect the configuration or lead to an error, a malfunction, or a failure of the electronic device and/or of a different part of the system. The error caused by a SEU may be correctable (i.e., a soft error), or a non-correctable error (i.e., a fatal error). An SEU rate may be proportional to the amount of memory in the electronic device. For FPGA's, the SEU rate is proportional to the amount of configuration memory. Even with a large amount of memory, a small percentage of SEU events may cause malfunction of the electronic device. When large volumes of electronic devices are produced, either as stand-alone products or as part of a system, even a small amount of SEU events may create problematic quality issues for a manufacturer or user of the electronic devices or systems.

In order to determine the SEU impact on a system, the system is sent to a neutron lab and is bombarded with real neutrons while the response of the system is observed. By observing the response, the SEU-related system failure rate is calculated, various SEU-related failure symptoms that can link similar field failures to SEU events are collected, areas in a system that are sensitive to SEU events and require most SEU protection are identified, and SEU-resilient system designs are validated. However, performing tests on systems in neutrons labs is time consuming and costly.

DETAILED DESCRIPTION

Overview

Figure 1:
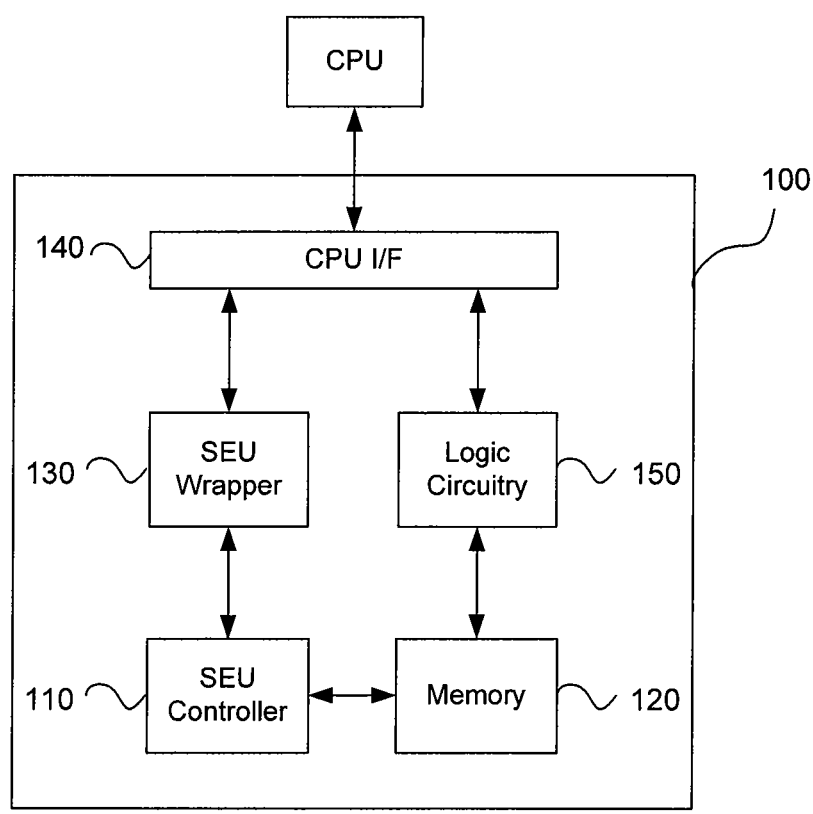
FIG. 1 illustrates an example electronic device that includes a SEU wrapper to control faults injected by an SEU controller into memory of the electronic device.

The present disclosure describes the use of a pattern scheme of fault injections to determine a response of an electronic device and/or a system that includes the electronic device when subjected to the faults. The electronic device may be chip or an integrated circuit, such as a field programmable gate array (FPGA) or an application specific integrated circuit (ASIC). The memory may comprise a plurality of memory elements that stores information that determines the functionality of the integrated circuit. The response of the electronic device and/or the system subjected to faults may emulate the response of the electronic device and/or system when subjected to a SEU. The response may be determined, or data may be collected to determine the response, while the electronic device and/or the system is in an operation mode, such as when the system is receiving, transmitting, and/or outputting packets of information (e.g., network traffic). The present disclosure also describes the use of a single event upset (SEU) wrapper to control the injection of faults into memory of the electronic device and/or the system. The SEU wrapper is in communication with a SEU controller. The SEU controller injects faults into the plurality of memory elements.

The SEU wrapper provides the SEU controller with a pattern scheme. From the pattern scheme, the SEU controller may determine where, when, how often, and/or how many faults to inject into the plurality of memory elements.

In one example, the pattern scheme includes bursts of one or more faults to be injected. A single injection of a burst includes consecutively injecting one or more faults into the array of memory blocks. In one example, frames of the memory are scanned for one or more errors caused by the injection of fault. The errors may be detected and/or corrected. In one example, an average of 40-50 milliseconds elapses before an error in the memory caused by a fault injection is detected and/or corrected. After the one or more errors is detected and/or corrected, the information is recorded, such as by being saved in a register. For example, a counter for the number of errors detected and a counter for the number of errors corrected may be updated when the errors are detected and corrected. In one example, to update the counters, the SEU controller may send to the SEU wrapper an indicator that indicates that an error was detected. The SEU wrapper receives the indicator and updates a counter stored in a register of the SEU wrapper to indicate that an error was detected. In addition, the SEU controller may send to the SEU wrapper a second indicator that indicates that an error was corrected. The SEU wrapper receives the second indicator and updates a second counter stored in a register to indicate that the error was corrected. The first and second counters may be used to generate statistical information about the behavior of the electronic device when subjected to faults.

In one example, the pattern scheme includes a rate of fault injection. Based on the rate of the fault injection, the SEU controller injects faults into the memory. The rate of fault injection may be a fault injection per a period of wait time. After the SEU controller injects a burst of faults and detects and/or corrects one or more errors that were created from injecting the burst, the SEU controller waits for a period of time before injecting another burst. The pattern scheme may also include a time period to inject faults. The SEU controller injects bursts of faults and detects and/or corrects errors (e.g., at the fault injection rate) until the time period for injecting faults expires.

Alternatively or in addition, the pattern scheme may include a first value indicating a number of one or more consecutively injected faults that are included in one or more bursts of fault injections, a period of time to wait; and a second value that indicates a number of one or more bursts to be injected; and/or a burst pattern. The SEU wrapper may also send the SEU controller a fault injection mode of operation in which to be configured. The fault injection mode may be a mode that injects a plurality of memory elements with a single-bit error and corrects errors that are correctable; a mode that injects a multi-bit error and corrects errors that are correctable; a mode that injects a plurality of memory elements with a single-bit error but does not perform any error correcting; or a mode that injects a plurality of memory elements with a multi-bit error but does not perform any error correcting. Based on the pattern scheme, the SEU controller injects a first burst into the plurality of memory elements. The SEU controller detects and/or corrects an error in one of the plurality of memory elements each time a fault is injected into the plurality of memory elements. After the burst has been injected and the errors are detected and/or corrected, the SEU controller waits for the period of time. The SEU controller may determine whether to inject another burst of faults based on the pattern scheme. If the SEU controller determines to inject another burst of faults, then after the period of time to wait expires, the SEU controller injects another burst of faults.

The SEU controller may determine whether to inject another fault and/or burst of faults based on a determination that the SEU controller injected fewer bursts than the number of bursts to be injected that was determined from the pattern scheme. If all of the bursts have not been injected, the SEU controller injects a second burst. The SEU controller waits for the period of time to wait. After waiting, the SEU controller determines whether to inject another burst. If another burst is to be injected, then the SEU controller injects another burst of fault and the process repeats. If no more bursts are to be injected, for example, if the number of bursts to be injected that was determined from the pattern scheme has been injected, then the SEU controller determines to no longer inject more faults. In one example, after determining not to inject more faults, the SEU controller exits a fault injection mode of operation and enters an idle state. In the idle state, the SEU controller waits to receive another pattern scheme.

During the period of time, the electronic device and/or system may perform a system check. The system check may monitor the performance of the electronic device individually or the system overall. In one example of a system check, packets or bytes of information, such as packets of network traffic, are received by the electronic device and/or the system and the performance of the electronic device and/or the system is monitored as the packets of information are processed and/or routed through the system. The packets may be sent through the system while the system and/or the electronic device is in an operation mode, or alternatively, while the system and/or the electronic device is in a simulation of an operation mode. The electronic device and/or system may determine whether the received packets successfully passed or were dropped while being sent through the electronic device and/or the system. The electronic device and/or system may have various monitoring schemes. For example, the electronic device may have counters that count the packets that have successfully passed through an interface and/or have been dropped in a data path. The electronic device may use error correction code (ECC), parity checks, checksums, cyclic redundancy check (CRC), or other error detection and/or correction processes to determine whether the electronic device and/or the system as encountered a failure.

In one example, the SEU controller may not inject more faults into memory if the electronic device and/or the system detects a failure. The SEU controller may not inject more faults if a failure is detected even if the pattern scheme provides the SEU controller to inject more faults. If a failure is detected, the electronic device and/or system may be reset or rebooted. In one example, the system uses system software to determine when to stop the SEU controller from injecting more faults. If a system failure has occurred as a result of an injection of fault, the system software may determine to stop the SEU controller from injecting more faults or bursts of faults. If the electronic device and/or the system does not detect a failure, and the SEU controller determines from the pattern scheme to inject another burst of faults, then after the period of time to wait elapses, the SEU controller injects another burst of faults and the process repeats.

If a failure is detected, the failure may be logged. In one example, when the component of the electronic device and/or the system detects a failure, the electronic device and/or the system sends information of the detected failure to a processor, such as a central processing unit (CPU), of the system. The information of the failure may include where the failure occurred, when the failure occurred, and/or the type of failure (e.g., whether the failure was fatal or non-fatal). Other information of the failure may be included. The CPU and/or another component of the system may generate a log of the failure. The log includes information of the failure. The log may also include information of the fault injections, such as the number of faults that were detected and/or corrected before the failure was detected.

The log of the failure, considered alone, in combination with information of the fault injections (e.g., the number of faults injected, detected, and/or corrected), and/or in combination with other logs of failures, may be used to determine a response of the electronic device and/or the system. Statistics and other information may be included in the response. The response may include the types of failures including fatal errors and non-fatal errors. The response may also include a percent of injected faults that can cause recoverable, unrecoverable, and silent errors for the electronic device; a failure rate of the electronic device and/or the system. The response may include SEU-related failure symptoms. The response may include a correlation of the failure caused by fault injections with failures that may be encountered out in the field, such as a SEU caused by an alpha particle or a neutron. The response may include areas in the system that are sensitive to SEU events and/or areas that require SEU protection. The response may include and validations of SEU-resilient system designs. The response may provide an analysis, such as a statistical analysis of a SEU emulation. The response may include the impact of a real SEU event when the electronic device and/or the system is carrying live network traffic. Other information that indicates the behavior of the electronic device and/or the system may be generated from the logs of the failures and/or the fault injection information and included in the response.

FIG. 1 illustrates an example electronic device 100, according to an embodiment of the present disclosure. The electronic device 100 includes a single event upset (SEU) controller 110, a memory 120, a SEU wrapper 130, and a central processing unit (CPU) interface (I/F) 140. Additional, different, or fewer components may be provided. For example, the electronic device 100 may include logic circuitry 150. As described in more detail below, the logic circuitry 150 may determine the functionality of the electronic device 100. In one example, the SEU controller 110 and/or the SEU wrapper 130 are components of the logic circuitry 150. In the same or an alternative example, a processor, such as a CPU, may be integrated with the electronic device 100.

FIG. 1 shows the logic circuitry 150 in communication with the memory 120 and the CPU I/F 140. The logic circuitry 150 may include one or more gates or blocks that perform logic functions such as AND, OR, NOT, NAND, NOR, or XOR functions. The logic circuitry 150 may comprise an array of logic blocks. The logic blocks may be programmable or reconfigurable, such as in an FPGA. Alternatively, the logic blocks may be non-programmable or customized for a particular use, such as in an ASIC.

The memory of the electronic device 120 may store data or information that determines the functionality of the array of logic blocks of electronic device 100. The memory 120 of the electronic device 100 may consist of individual memory elements. An individual memory element may be a flip flop or a latch. Each memory element may be configured to store one-bit of data. The memory may be read-only memory (ROM), random-access memory (RAM), programmable read only memory, electrically erasable programmable read-only memory (EEPROM), flash memory, or other memory. For an FPGA, the memory may be referred to as configuration memory.

FIG. 1 also shows the SEU controller 110 of the electronic device 100. In one example, the SEU controller 110 is a hardware component such as a logic circuit that comprises a plurality of logic gates. The SEU controller 110 may be a component separate from the logic circuitry 150. Alternatively, the SEU controller may be a component of the logic circuitry 150. In another example, the SEU controller 110 may be software encoded on one or more computer-readable storage media that is executable by the CPU. The electronic device 120 may execute the software using the processor. In an alternative example, the SEU controller 110 may be an electronic device separate from the electronic device 100 that communicates with the electronic device 100 by sending and/or receiving signals.

The SEU controller 110 is configured to inject fault into the memory 120. The SEU controller 110 may inject the fault into the memory 120 to determine the response, behavior or functionality of the electronic device 100 when an element of the memory 120 is corrupted. The fault may be injected into one or more memory elements of the memory 120. An individual memory element stores a state, such as a logic "0" or a logic "1." The injected fault corrupts the memory element by switching the state of the memory element, for example by changing the state of the memory element from a logic "0" to a logic "1" or from a logic "1" to a logic "0." The state of the one or more memory elements are changed to determine how the electronic device 100 behaves or performs when the one or more memory elements are corrupted.

The electronic device 100 may perform differently when one memory element is corrupted (e.g., changed to a different state than the current or correct state) as compared to when a different memory element is corrupted. For example, if one memory element is corrupted, the performance of the electronic device 100 may be unaffected. As a result, no errors will be generated by the electronic device 100. However, a different memory element may have different effects on the performance of the electronic device 100. For example, information, such as network traffic, that is flowing through the electronic 100 may be become corrupted or dropped. As another example, the electronic device 100 may undergo a fatal error and no longer be operable.

Injecting the faults may be performed to emulate a SEU. Circuitry components of the electronic device 100 may be used to detect a failure of the electronic device 100 that may emulate a failure resulting from a SEU. The electronic device 100 may send the information regarding the failure to the CPU and the CPU may generate a log of the failure. The electronic device 100 and/or the CPU may generate test data such as statistics based on the fault injections and the failures. The test data may be correlated with failures that the electronic 100 may encounter in the field. The failures may be linked to an SEU. The test data may include statistics, such as the percentage of injected faults that yield recoverable errors, unrecoverable (i.e., fatal) errors, silent errors (e.g., the electronic device 100 sustained traffic loss while no other error was detected), and silent crashes (e.g., the electronic device 100 crashed without any errors being logged by the electronic device 100). The statistics may be used to improve the electronic device's immunity from SEUs or improve the electronic device's handling of SEUs.

Generally, for a large percentage of the memory elements (e.g., above 90%), the performance of the electronic device 100 is not affected when a memory element becomes corrupted. Accordingly, to obtain a sufficient amount of statistics in order to determine an adequate response of the electronic device 100, the SEU controller 110 may inject several or many faults. The fault injections may number in the thousands before a complete evaluation of the electronic device 100 may be obtained. One way to inject the faults is to inject one fault into the memory 120, evaluate the performance of the electronic device 100, reset the electronic device 100, and then inject another fault into the electronic device 100. When the electronic device 100 is being reset, the electronic device is unavailable to receive, process, or output information, such as network traffic flowing through the system. This way may be inefficient and consume a large amount of time.

As shown in FIG. 1, the SEU controller 110 is in communication with a SEU wrapper 130. In one example, the SEU wrapper 130 may be hardware integrated in the electronic device 100. The SEU wrapper 130 may be a logic circuit comprising a plurality of logic gates. As shown in FIG. 1, the SEU wrapper 130 may be a component separate from the logic circuitry 150. Alternatively, the SEU wrapper may be a component of the logic circuitry 150. In an alternative example, the SEU wrapper is software encoded on one or more computer-readable storage media. The electronic device 100 may execute the software using the CPU. In another example, the SEU wrapper 150 may be an electronic device separate from the electronic device 100 that communicates with the electronic device 100 by sending and/or receiving signals. In another example, the SEU wrapper 130 is a component of the SEU controller 110.

The SEU wrapper 130 is configured to communicate commands, instructions, and/or other information to the SEU controller 110 that instruct or trigger the SEU controller 110 to inject fault into the memory 120. The commands or instructions may be included as part of a control signal sent from the SEU wrapper 130 to the SEU controller 110. The instructions may indicate when, how often, where (e.g., which memory element), and/or how many times the SEU controller 110 is to inject fault into the memory 120. Alternatively, the instructions may include information from which the SEU controller 110 determines when, where, how often, and/or how many times the SEU controller 110 is to inject fault into the memory 120.

When, where, how often, and/or how many faults the SEU controller 110 is to inject may be implemented as a pattern scheme. In one example, the pattern scheme may include a rate of fault injection. The rate of fault injection may be a fault injection per a period of time to wait. After receiving the rate, the SEU controller 110 injects a fault, detects and/or corrects one or more errors from the fault injection, waits for the period of time, and then injects another fault after resetting or without resetting the electronic device 100.

Alternatively or in addition, the rate of fault injection may be a burst of fault injections per a period of time to wait. A burst of fault injections may refer to one or more fault injections that are consecutively injected. After a fault is injected, an error in the memory 120 is detected and/or corrected. After the error is detected and/or corrected, another fault is injected. The faults are injected until there are no more faults in the burst to be injected. During a burst of fault injections, the SEU controller 110 waits little or no wait time in between detecting and/or correcting an error and injecting the next fault in the burst. The consecutive faults may be injected without resetting the electronic device 100. After the SEU controller 110 injects a burst of faults, the SEU controller 110 waits for the period of time, and then determines whether to inject another burst of faults. If the SEU controller 110 determines to inject another burst of faults, then the SEU controller 110 injects another burst of faults, detects and/or corrects errors in the memory after each individual fault injection during the burst, waits for a period of time after all of the individual faults in the burst have been injected, and then determines whether to inject another burst of faults. The SEU controller 110 repeats the process until the SEU controller 110 determines that no more bursts of faults are to be injected.

During the period of time that the SEU controller 110 is waiting, the electronic device 100 may perform a failure check to determine what effects, if any, the fault injection had on the performance of the electronic device 100. In many situations, a fault injection has no effect on the performance of the electronic device 100. For example, no failures may be detected as a result of the fault injection. In another example, a failure may be detected and subsequently corrected. However, in some cases, a fault injection may produce a failure that cannot be corrected. An uncorrected error may indicate that the electronic device 100 is unstable or is unable to output correct data. If a failure is detected, the electronic device, using system software, may stop the SEU controller from injecting more faults. The SEU controller may not inject more faults even if the pattern scheme indicates that more faults are to be injected. The electronic device 100 may be reset or rebooted after a failure is detected. If no failures are detected, the SEU controller 110 determines whether to inject another fault. The SEU controller may determine to inject more faults if the pattern scheme indicates more faults, or more bursts of fault, are to be injected.

The failure check of the electronic device 100 may include one or more error detection and/or correction circuitry that monitors components of the electronic device 100 for failures. The monitoring components may detect a failure before, after, or during the period of wait time after a burst of fault is injected. The monitoring circuitry may include counters that count packets of information, bytes, or other traffic going through the electronic device 100. The monitoring circuitry of the electronic device 100 may use various functions, such as ECC, parity checking, checksums, CRC, or other error detection functions to determine whether packets of information were successfully passed through the system, dropped, or corrupted. The electronic device 100 may also include protocol checking circuits that detect illegal states of the hardware of the electronic device, and send interrupt signals to the CPU after detecting the illegal states. The CPU may also detect failures using a watch-dog-timer to remain in an awake state. In addition, packet generators and receivers that are external to the electronic device 100 may be used to generate and receive packets and compare how much of the generated packets passed through the system and reached the packet receiver. Components or signals of the electronic device 100 may be monitored to detect a failure, such as the memory 120, other internal memory, state machines, data paths, protocols (such as the protocol of the interface between the electronic device 100 and electronic device, chips, integrated circuits, or other circuitry external to the electronic device 100), and signals such as handshake signals and signals propagating along data paths.

If the electronic device 100 detects a failure, the electronic device 100 may determine not to inject another burst. If the electronic device does not detect a failure, then the electronic device 100 may determine whether to inject another burst of faults based on instructions or other information received from the SEU wrapper 130.

In one example, the pattern scheme instructs the SEU controller 110 to inject only one burst of fault, in which the SEU controller 110 injects the burst, waits for the period of time, and then does not inject any more faults or bursts of faults until another pattern scheme is received. In another example, the pattern scheme instructs the SEU controller 110 to inject a plurality of bursts over a period of time to inject the faults. The SEU controller 110 may determine a rate of fault injection based on the plurality of bursts to be injected over the period of time. After receiving the pattern scheme, the SEU controller 110 injects faults or bursts of faults at the rate of fault injection until the period of time to inject fault expires.

Alternatively or in addition, the pattern scheme includes a number of faults or a number of bursts of faults to be injected into the electronic device 120. The pattern scheme may include a period of time that the SEU controller 110 is to wait in between fault injections or bursts of fault injections. In addition, the pattern scheme includes a number of times that the fault injections or bursts of fault injections are to be injected. After determining the pattern scheme, the SEU controller 110 injects an initial fault, or an initial burst of faults. The SEU controller 110 detects and/or corrects one or more errors produced by the fault injection or burst of fault injections. The SEU controller 110 waits for a period of time. The SEU controller 110 determines whether another fault or another burst of faults is to be injected. If another fault or another burst of faults is to be injected, then the SEU controller 110 injects the fault or the burst of faults after waiting for the period of time. Subsequent faults and/or bursts of faults after the initial fault or initial burst of fault may be injected without resetting the electronic device 100.

The SEU controller 110 may determine based on the instructions a mode for the SEU controller 110 to be configured. The mode may be a fault injecting mode or a detection mode. In a fault injecting mode, the SEU controller 110 is in an active state and is injecting faults and/or determining whether to inject more faults. In a detection mode, the SEU controller 110 is in an idle state and is waiting to receive instructions to inject faults. Additionally, a mode may indicate whether or not to correct errors that can be corrected. During the modes, the SEU controller 110 is scanning frames of the memory 120 to detect corrupted memory elements. In some modes, as described below, the SEU controller 110 may correct corrupted memory elements that are detected. The SEU controller 110 may detect and/or correct corrupted memory elements using detection and correction techniques. In one example, the SEU controller 110 detects and/or corrects memory elements using error correction code (ECC).

In one example, the detection modes include a Mode 0 and a Mode 1. In Mode 0, the SEU controller 110 is operating in a "Detection Only" mode. In Mode 0, the SEU controller 110 is in an idle state and does not inject fault into the electronic device 120. Mode 0 may be a default mode of the SEU controller 110. The SEU controller 110 may be configured to be in Mode 0 when the electronic device 100 is in operation, such as when the electronic device 100 is operating out in the field. Out in the field, the electronic device 100 may be exposed to alpha particles or neutrons that may cause a SEU. In Mode 0, the memory elements are scanned to detect any corruption, such as corruption caused by a SEU. While in Mode 0, the SEU controller 110 is scanning frames of the memory 120 to detect errors in the memory elements. The errors may be detected using ECC. Other error detection techniques may be used. The SEU controller 110 may be configured to communicate the information related to errors that are detected to the SEU wrapper 130. The SEU wrapper 130 may be configured to store the information related to the detected errors.

In Mode 1, the SEU controller 110 is operating in a "Detection & Auto Correction" mode. In Mode 1, the SEU controller 110 is in an idle state and does not inject fault into the memory 120. The SEU controller 110 may be configured to operate in Mode 1 when the electronic device 100 is operating out in the field, where the electronic device 100 may be exposed to alpha particles or neutrons that may cause a SEU. While in Mode 1, the SEU controller 110 is scanning frames of the memory 120 to detect errors in the memory elements. In Mode 1, the SEU controller automatically corrects the error. The errors may be detected and/or corrected using ECC. Other error detection techniques may be used. The SEU controller 110 may be configured to communicate information related to any error detection and/or correction, such as the number of errors detected and/or the number of errors corrected, to the SEU wrapper 130. The SEU wrapper 130 may be configured to store the information related to the detected errors and/or the corrected errors.

The fault injection modes may include Mode 2, Mode 3, Mode 4, and Mode 5, but additional, different or fewer modes may be provided. In Mode 2, the SEU controller 110 is operating in a "Single-Bit Error Injection and Correction" mode. The SEU controller 110 injects a single-bit error into the memory 120. The single-bit error corrupts one bit in the memory 120. The location of the memory element that the single bit is to corrupt may be determined randomly. For example, the memory elements in the memory 120 may each be associated with a unique address. The address of the memory element to be corrupted may be determined by randomly generating a value that corresponds to one of the addresses of the memory elements. Either the SEU wrapper 130 or the SEU controller 110 may be configured to randomly generate the value associated with an address and/or determine the address of the memory block to be corrupted. The randomly generated value and or the address corresponding to the value may be part of the pattern scheme. Alternatively, other components in the electronic device 100 may be used to randomly generate the value. For a burst of fault injections, addresses may be determined for the number of fault injections in the burst. A plurality of values is randomly or otherwise generated, with the number of values being equal to the number of faults in the burst. When the faults in the burst are consecutively injected, the faults are injected to the memory elements having addresses corresponding to the values that were randomly generated.

After the single-bit error is injected into the memory 120, an error resulting from the fault injection may be detected by the SEU controller 110 when the SEU controller 110 scans frames of the memory 120. If an error is detected and the error is recoverable, then the SEU controller 110 corrects the error. The SEU controller 110 may detect and/or correct the error using ECC. The SEU controller 110 may be configured to communicate information related to the error detection and/or correction, such as the number of errors detected and/or the number of errors corrected, to the SEU wrapper 130. The SEU wrapper 130 may be configured to store the information related to the error detection and/or error correction. In one example, the SEU wrapper 130 updates a counter upon receiving information that an error was detected. The SEU wrapper 130 may also update another counter upon receiving information that an error was corrected.

In Mode 3, the SEU controller 110 is operating in a "Multi-Bit Error Injection and Correction" mode. In Mode 3, the SEU controller 110 injects a multi-bit error into the memory 120. The multi-bit error corrupts more than one memory element in the memory 120. Like Mode 2, the bits to be corrupted may be determined randomly or otherwise. For example, the addresses of the memory elements to be corrupted may be determined by randomly generating values that correspond to addresses of the memory elements. In one example, the SEU wrapper 130 determines the addresses of the bits to be corrupted and includes the address information in the pattern scheme sent to the SEU controller 110. In another example, the SEU controller 110 determines the addresses of the bits to be corrupted.

After the multi-bit error is injected into the memory 120, corrupted memory elements may be detected and/or corrected by the SEU controller 110 when the SEU controller 110 is scanning frames of the memory 120. If the errors are detected and the errors are recoverable error, then the SEU controller 110 may correct the errors. Alternatively, even if the errors are correctable, the SEU controller 110 may not be able to correct the errors. For example, if the SEU controller 110 is using ECC for error detection and/correction, the SEU controller 110 is not able to identify the location of the errors for multiple errors. The SEU controller 110 is not able to correct the errors and only error detection is performed. The SEU controller 110 may be configured to communicate information related to any error detection and/or correction, such as the number of errors detected or the number of errors corrected, to the SEU wrapper 130. The SEU wrapper 130 may be configured to store the information related to any error detection and/or error correction. In one example, the SEU wrapper 130 updates a counter upon receiving information that an error was detected. The SEU wrapper 130 may also update another counter upon receiving information that an error was corrected.

When multi-bit error injections are performed, the SEU controller 110 may inject only one burst having one fault. The electronic device 100 may be reset after the multi-bit injection is performed. As explained above, ECC cannot correct multi-bit errors. ECC can only detect the errors. When the errors are not corrected, additional injections create additional errors. As errors compound, the electronic device 100 may fail because the memory 120 has too many corrupted bits. The electronic device 100 may be reset to correct the errors.

In Mode 4, the SEU controller 110 is operating in a "Single-Bit Error Injection Only" mode. In Mode 5, the SEU controller 110 is operating in a "Multi-Bit Error Injection Only" mode. Modes 4 and 5 are similar to modes 2 and 3 respectfully, except that in Modes 4 and 5, the errors are not corrected.

The instructions sent from the SEU wrapper 130 to the SEU controller 110 may also include a start flag that indicates whether the SEU controller 110 is to exit the detection mode, such as Mode 0 or Mode 1, and enter a fault injection mode, such as Mode 2, Mode 3, Mode 4, or Mode 5. If the SEU controller 110 determines that the start flag indicates exiting the detection mode, then the SEU controller determines which fault injection mode to enter. If the SEU controller 110 identifies Mode 2, Mode 3, Mode 4, or Mode 5, then the SEU controller 110 enters the identified mode. Alternatively, if the SEU controller 110 identifies a detection mode, such as Mode 0 or Mode 1, then the SEU controller 110 returns to an idle state and waits for another message from the SEU wrapper 130.

One pattern scheme may be used to indicate when, where, how often, what mode to operate in, and/or how many times the SEU injects fault into the memory 120. Alternatively, multiple pattern schemes may be used. For example, multiple pattern schemes may be used to include a start flag, a mode of the SEU controller 110, a number of faults to inject, a number of bursts of faults to inject, and/or a period of time to wait in between injections. The one or more pattern schemes may be sent from the SEU wrapper 130 to the SEU controller 110 as one or more control signals.

Figure 2:
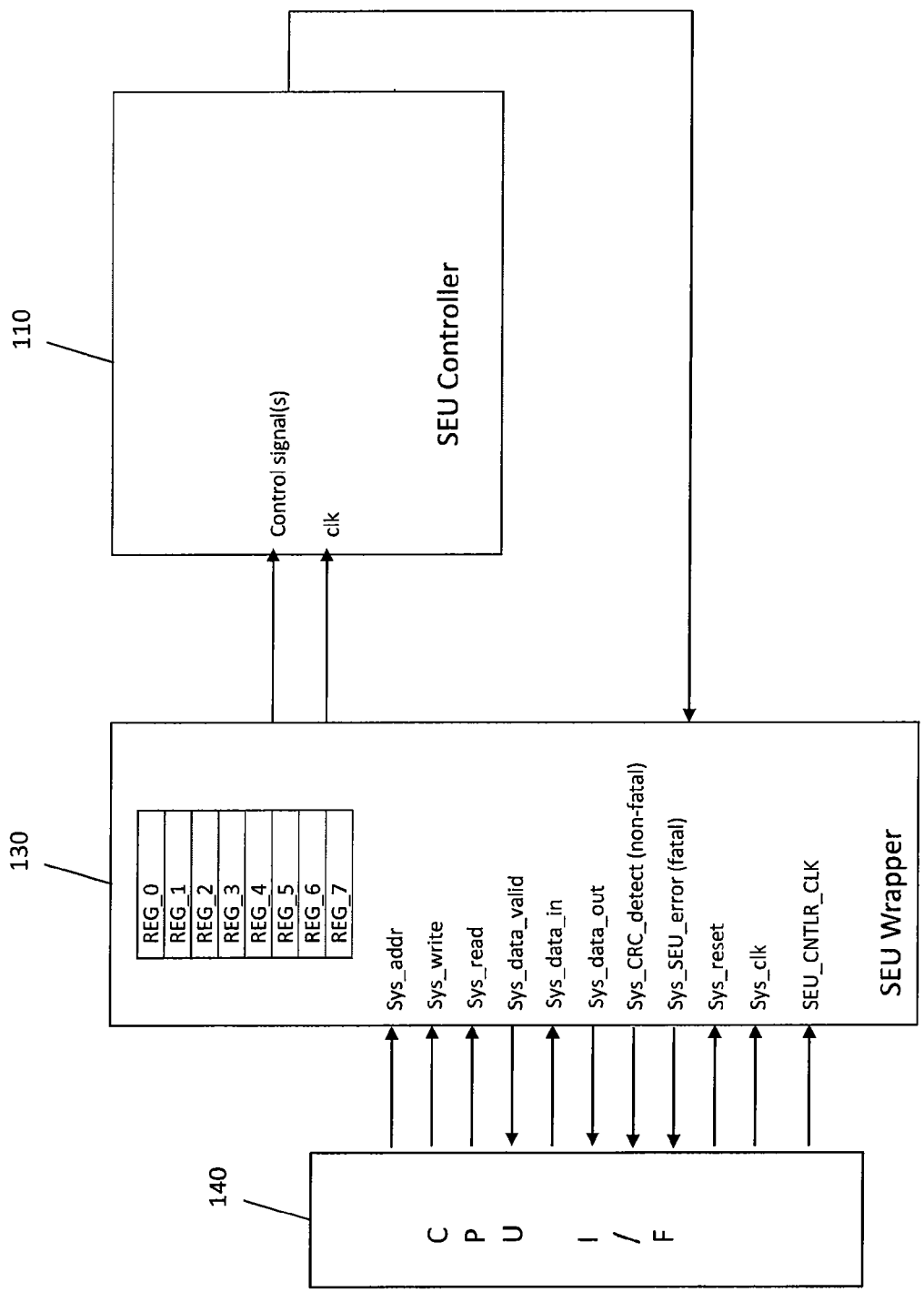
FIG. 2 illustrates the SEU wrapper and the SEU controller of FIG. 1 in more detail.

FIG. 2 shows the SEU controller 110, the SEU wrapper 130, and the CPU I/F 140 in more detail. SEU wrapper 130 is in communication with SEU controller 110 using a parallel interface. The parallel interface may be a 16-bit databus, but other bit widths may be used. The information used to control the fault injections may be communicated over the parallel interface. In one example, the SEU controller 100 and the SEU wrapper 130 initiate communication by performing one or more handshaking operations. After performing the handshaking operations, the SEU wrapper 130 sends a pattern scheme, such as by sending one or more control signals, for controlling the fault injections over the parallel interface to the SEU controller 110. In addition, the SEU wrapper 130 may provide a clock signal to the SEU controller 110 that the SEU controller 110 uses to operate.

The SEU wrapper 130 may be configured to store the information that controls the fault injections, the errors that are detected, and/or the status of the SEU controller 110. The information may be stored in registers. As shown in FIG. 2, a first register, REG_0, stores a start flag that indicates to the SEU controller 110 to be in an idle state or to be in an active state and inject faults. A second register, REG_1, stores a value indicating a mode in which the SEU controller 110 is to be configured. The values may correspond to Modes 0-5 as described above. A third register, REG_2, stores a value indicating the number of consecutive error injections and corrections to be performed. For example, REG_2 may indicate the number of fault injections in a burst of fault injections. A fourth register, REG_3, stores a value indicating the time period that the SEU controller 110 is to wait in between bursts of fault injections. A fifth register, REG_4, stores a value representing the numbers of bursts that are to be injected. A sixth register, REG_6, stores a value representing error values. For example, if the SEU controller 110 is operating in Mode 0 or Mode 1, REG_6 stores errors that were detected by the electronic device 120. Alternatively, if the SEU controller 110 is operating in Mode 2 or Mode 3, REG_6 stores the number of fault injections and/or the number corrections that were performed. If the SEU controller 110 is operating in Mode 4 or Mode 5, REG_6 stores only the number of fault injections because in Mode 4 or Mode 5, corrections are not performed. A seventh register, REG_7, stores information regarding the status of the SEU controller 110. For example, REG_7 may store information indicating whether the SEU controller 110 is in an auto-correction mode (e.g., Mode 1), whether the SEU controller 110 is performing any task other than basic detection of errors (e.g., injecting fault into the memory), whether the SEU controller 110 is in an initializing state, whether an error was detected and/or corrected, whether the SEU controller 110 acknowledged an attempt to simulate a SEU, and/or whether the SEU controller 110 completed a scan of the memory 120. In addition, REG_7, or another register, may store information that indicates that a particular event occurred at some point in time during scanning of the memory 120. To illustrate, a first bit may be used to indicate that an error was detected, and a second bit may be used to indicate that an error was detected at some point during scanning of the memory 120. After the error is corrected, the first bit may no longer indicate that the error was detected, and the second bit may still indicate that an error was detected.

As shown in FIGS. 1 and 2, the SEU wrapper 130 is in communication with a central processing unit (CPU) interface (I/F) 140. The CPU I/F 140 may read data from (FIG. 2, Sys_read) or write data to (FIG. 2, Sys_write) the registers (e.g., REG_0 to REG_7). The CPU I/F 140 may indicate the address (FIG. 2, Sys_addr) of the register to read from or write to. The SEU wrapper 130 may send data to (FIG. 2, Sys_data_out) or receive data from (FIG. 2, Sys_data_in) the CPU I/F 140. The SEU wrapper 130 may provide information to the CPU I/F 140 indicating whether the data is valid (FIG. 2, Sys_data_valid). The SEU wrapper 130 may send information regarding errors failures, such as whether the SEU controller 110 detected a non-fatal error (FIG. 2, Sys_CRC_detect) or a fatal error (FIG. 2, Sys_SEU_error). The CPU I/F 140 may provide information to the SEU wrapper 130 indicating to reset the electronic device (FIG. 2, Sys_reset). In addition, the CPU I/F 140 may provide one or more different clock signals (FIG. 2, Sys_clk, SEU_CNTLR_CLK) to the SEU wrapper 130.

In one example, SEU wrapper 130 may be configured to synchronize two different clock domains. For example, the SEU controller 110 may be configured to operate using one clock frequency and the SEU wrapper 130 may be configured to operate using a different clock frequency. The clock frequency that the SEU wrapper 130 uses may be higher than the clock frequency that the SEU controller 110 uses. The SEU wrapper 130 may be configured to synchronize the two different clock frequencies to operate under the higher clock frequency and communicate with the SEU controller 110 using the lower clock frequency. As shown in FIG. 2, the SEU wrapper 130 may be configured to send to the SEU controller 110 instructions for controlling the fault injections and a clock signal having a frequency on which the SEU controller 110 is configured to operate.

Shown in FIG. 2, the SEU controller 110 may communicate to the SEU wrapper 130 status information, such as whether the SEU controller 110 is in an auto-correction mode (e.g., Mode 1), whether the SEU controller 110 is performing any task other than basic detection of errors (e.g., injecting fault into the memory), whether the SEU controller 110 is in an initializing state, whether an error was detected and/or corrected, whether the SEU controller 110 acknowledged an attempt to simulate a SEU, and/or whether the SEU controller 110 completed a scan of the memory. The SEU controller 110 may write the status information to one or more registers (e.g., REG_7) in the SEU wrapper 130. The SEU controller 110 may also write information that an error was detected and/or corrected to one of the registers. For example, if the SEU controller 110 detects an error, the SEU controller 110 may write to REG_6 to update REG_6 to indicate that an error was detected. Similarly, if the SEU controller 110 corrects an error, the SEU controller 110 may write to REG_6 to update REG_6 to indicate that an error was corrected. In one example, a counter stored in REG_6 is incremented to indicate an error was detected, and another counter stored in REG_6 is incremented to indicate an error was corrected.

Figure 3:
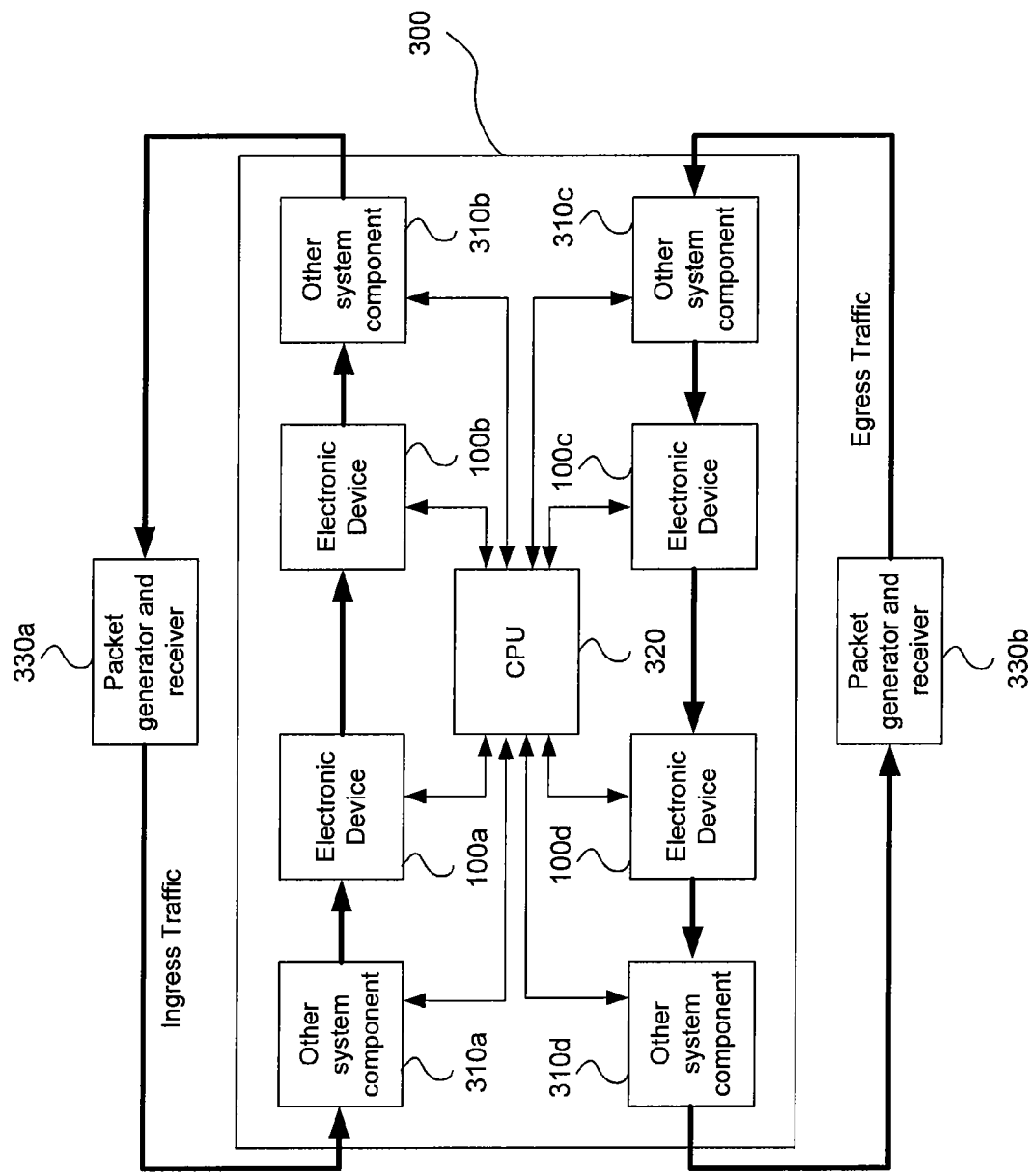
FIG. 3 illustrates a system that includes one or more electronic devices subjected to fault injections.

FIG. 3 illustrates a system 300 that includes one or more electronic circuits 100. The system in FIG. 3 shows four electronic devices 100a-d. More or less than four electronic devices may be used. The electronic devices 100a-d may be chips or integrated circuits, such as FPGAs or ASICs, as described above with reference to FIGS. 1 and 2. As shown in FIG. 3, each electronic device 100a-d is in communication with a CPU 320. Each of the electronic devices 100a-d is also in communication with other system components 310a-d. FIG. 3 shows four other system components 310a-d. However, less or more than four other components may be included in system 300. The other system components 310a-d may include an ethernet switch, a network processor, a MAC device, and/or a bus interface. Other components may be included. The components 310a-d be off-the-shelf components. Each of the devices 310a-d may have its own monitoring circuitry for monitoring, identifying, detecting, and/or correcting system failures. For example, an ethernet switch can track bad packets, such as packets that have bad CRC, illegal lengths, or bad packet header formats.

The 320 CPU may issue commands or instructions for injecting fault to one or more of the electronic devices 100a-d. The commands or instructions may include where, when, how often, and/or how many faults to inject into the memory 120 of the electronic devices 100a-d. The instructions may be part of a pattern scheme for injecting faults. Referring back to FIG. 1 or 2, the SEU wrapper 110 of one of the electronic devices 100a-d receives the instructions via a CPU I/F 140. The SEU wrapper 110 may store the instructions in registers. Based at least in part on the instructions received by the CPU 320, the SEU wrapper 130 sends instructions to the SEU controller 110 for injecting fault into the memory 120 of one or more of the electronic device 100a-d.

As explained above, one or more bursts of fault may be injected into the memory 120 of one or more of the devices 100a-d. Generally, for a large percentage of the memory elements (e.g., above 90%), the performance of the system 300 is not affected when a memory element becomes corrupted. Accordingly, to obtain a sufficient amount of statistics in order generate a behavioral profile of the system 300, the SEU controller 110 of the electronic devices 100a-d may inject several or many faults. The fault injections may number in the thousands before a complete evaluation of the system 300 may be obtained. One way to reduce time when injecting a large number of faults is to inject a burst of faults, where a burst may contain one or more fault injections. If a burst contains more than one fault, then the faults are consecutively injected into the memory 120. After each fault injection, the SEU controller 110 scanning the frames of the memory 120 detects and/or corrects the errors. After the error in the memory 120 is detected and/or corrected, another fault in the burst is injected. When all of the faults in a burst are injected, the SEU controller 110 waits for a period of time. During the wait period, a system failure check of the system 300 is performed. When a system failure check of the system 300 is performed, the components of the system 300, such as the electronic devices 100a-d and the other system components 310a-d, and not just a single electronic device, are being monitored for failures. As an example, a burst of faults may be injected into electronic device 100a. During the wait period, monitoring circuitry of a component of the system 300, such as monitoring circuitry of electronic device 100a, or monitoring circuitry of other system components such as electronic device 100b-d or other system components 310a-d, may monitor the system 300 and/or detect a failure of the system 300 resulting from the fault injection. In a system with more than one electronic device 100, a corrupted memory element of one electronic device may impact the performance of the electronic device having the corrupted memory element, a different component of the system 300, and/or the system 300 overall. By injecting faults into an electronic device 100a-d of the system 300 and monitoring responses of any or all of the components of the system 300, the response of the entire system 300, instead or in addition to the response of a single electronic device, can be determined. The response may be indicative of an SEU impact on a single component of the system, and/or the entire system.

A system failure check of the system 300 may be similar to the failure check for a single electronic device 100. The system 300 and/or the individual components of the system 300, including the electronic devices 100a-d and/or the other system components 310a-d, may have circuitry that monitors the performance of the electronic devices 100a-d and/or the system 300 and detects failures. For example, the electronic devices 100a-d may have counters that count packets, bytes, or other traffic going through the electronic device 100. The monitoring circuitry of the system 300 may use various functions, such as ECC, parity checking, checksums, CRC, or other error detection functions to determine whether packets were successfully passed through the system, dropped, or corrupted. The system 300 and/or components of the system 300 may also include protocol checking circuits that detect illegal states of the hardware of the system 300, and send interrupt signals to the CPU 320 after detecting the illegal states. The CPU 320 may also detect failures using a watchdog-timer to remain in an awake state. In addition, as shown in FIG. 3, packet generators and receivers 330a,b that are external to the system 300 may be used to generate and receive packets and compare how much of the generated packets passed through the system 300 and reached the packet receiver. Components or signals of the system 300 may be monitored to detect a failure. The components and signals may include the memory 120 of the electronic devices 100a-d, other internal memory, state machines, data paths, circuitry or data paths on the other system components 310a-d, protocols (such as the protocol of the interface between the electronic devices 100a-d and/or the electronic devices 100a-d and other system components 310a-d, and signals such as handshake signals and signals propagating along data paths in the system 300. Other components or signals in the system 300 may be monitored.

As shown in FIG. 3, packet generators and receivers 330a,b that are external to the system 300 may be used to generate and receive packets and compare how much of the generated packets passed through the system 300. As packets are being sent through the system 300, the system 300 is said to be running in an operation mode because the system 300 is functioning as it would while normally operating. Packets may be generated and sent through the system 300 at all times during the fault injection process, including while the SEU controller 110 is injecting faults and/or the SEU controller is waiting in between bursts of fault injections. Alternatively, the packets are generated and sent through the system only during the waiting period in between bursts of fault injections. As shown in FIG. 3, during normal operation, the system 300 may have egress traffic and ingress traffic passing through the system 300. Egress traffic refers to the traffic going out of the system 300 and ingress traffic refers to the traffic coming into the system 300. Some components of the system 300 may process and/or transmit the egress traffic and some components of the system 300 may process and/or transmit the ingress traffic. As shown in FIG. 3, the system 300 may be connected with packet generator/receiver 330a to monitor and/or compare the ingress traffic passing through electronic devices 110 a,b and other system components 310 a,b. Also, as shown in FIG. 3, the system may be connected with packet generator/receiver 330b to monitor and/or compare the egress traffic passing through electronic devices 100c,d and system components 310 c,d. Separate or combined statistics and other information on the fault injections may be generated for the egress and ingress components of the system 300.

During the wait period, if system 300 detects a failure, the electronic device 100a-d detecting the failure may send the information regarding the failure to the CPU 320. The CPU 320 may generate a log of the failure. The system 300 may generate test data such as statistics based on the fault injections and the failures. The test data may be correlated with failures that the system 300 may encounter in the field. The failures may be linked to an SEU. The test data may include statistics, such as the percentage of injected faults that yield recoverable errors, unrecoverable (i.e., fatal) errors, silent errors (e.g., the system 300 sustained traffic loss while no other error was detected), and silent crashes (e.g., the system 300 crashed without any errors being logged by the system 300). The statistics may be used to improve the system's immunity from SEUs or improve the system's handling of SEUs.

If a system failure is detected, the system 300 may have to be rebooted before injecting more faults. If, on the other hand, the period of time to wait has elapsed and no system failures were detected, the SEU controller 110 may determine to inject another burst of faults. The SEU controller 110 may determine to inject more faults based on the pattern scheme received from the SEU wrapper 130. In one example, the same SEU controller 110 may receive a pattern from the CPU 320 to inject several bursts of faults. Provided that none of the monitoring circuitry in the system 300 detected a system failure, the same SEU controller 110 injects bursts of faults until the pattern scheme received from the SEU wrapper 130 indicates that no more bursts are to be injected. In another example, the pattern scheme instructs one of the electronic devices 100a-d to inject only one burst of faults. Subsequently the same or different pattern scheme instructs a different electronic device 100a-d to inject a second burst of faults. Different electronic devices 100a-d in the system may be selected for injecting a burst of faults until the CPU 320 does not issue any more fault injection commands.

If the SEU controller 110 injects all of the bursts and the system 300 does not detect any system failures, then the system 300 may log the results. In addition, as explained above, after a single fault is injected into the memory 120 of an electronic device 100a-d, the SEU controller 110 corrects and/or detects the corrupted memory element. The SEU controller 110 may send information of the detection and/or the correction to the SEU wrapper 130. The information of the detection and/or the correction may be updated using one or more counters stored in the SEU wrapper 130. The system 300 may use error detections and/or correction information alone or in combination with detected system failures to generate statistics and other information of the response of the system 300 when subjected to faults.

Figure 4:
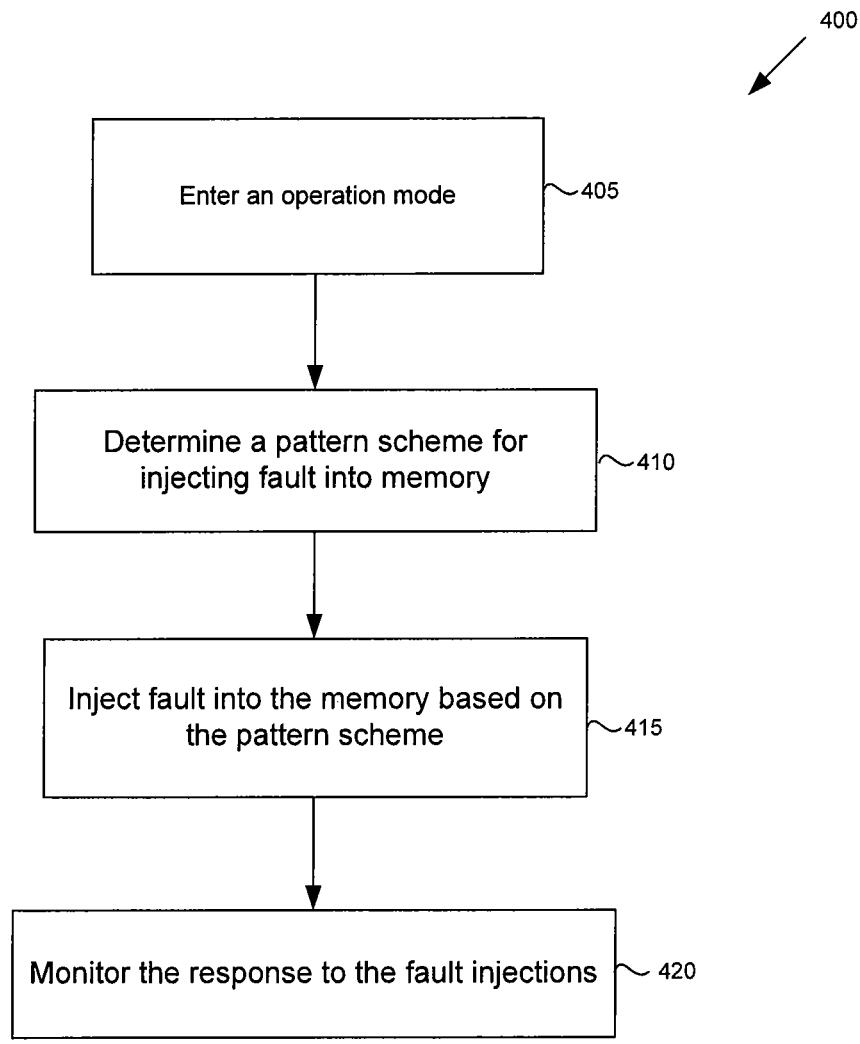
FIG. 4 illustrates an example method for using a pattern scheme to inject bursts of faults into an electronic device.

FIG. 4 is a flow chart illustrating a general method 400 for monitoring the response of the system 300. Although the following method 400 refers to the system 300, the method may be used to monitor the response of a single chip or integrated circuit, such as electronic device 100 shown in FIGS. 1 and 2. At step 405, the system 300 enters an operation mode. During the operation mode, packets or bytes of information, such as packets of network traffic, are received by the system 300 and sent through the system 300. At step 410, an SEU controller 110 determines a pattern scheme for injecting faults into memory of an electronic device of the system 300. The SEU controller may determine the pattern scheme based on information, including instructions and/or commands, received from an SEU wrapper. At step 415, the SEU controller injects faults into the memory based on the pattern scheme. At step 420, the system 300 monitors the response of the system 300 to the fault injections. At step 420, the system 300 may monitor different components of the system for failures. The system 300 may use various monitoring schemes, such as using counters that count the packets that have successfully passed through an interface and/or have been dropped in a data path, error detection and/or correction functions such as error correction code (ECC), parity checks, checksums, cyclic redundancy check (CRC), or other error detection and/or correction functions. The system 300 may use protocol checking circuits that detect illegal states of hardware components of the system 300 and send interrupt signals to the CPU after detecting the illegal states. The CPU may also detect failures using a watch-dog-timer to remain in an awake state. In addition, the system 300 may use external packet generators and receivers to generate and receive packets and compare how much of the generated packets passed through the system and reached the packet receiver. Components or signals of the system 300 may be monitored to detect a failure. The components and signals may include the memory 120, other internal memory, state machines, data paths, circuitry and data paths on other system components 310a-d, protocols (such as the protocol of the interface between the electronic device 100 and electronic device, chips, integrated circuits, or other system components 310a-d), and signals such as handshake signals and signals propagating along data paths.

Figure 5:
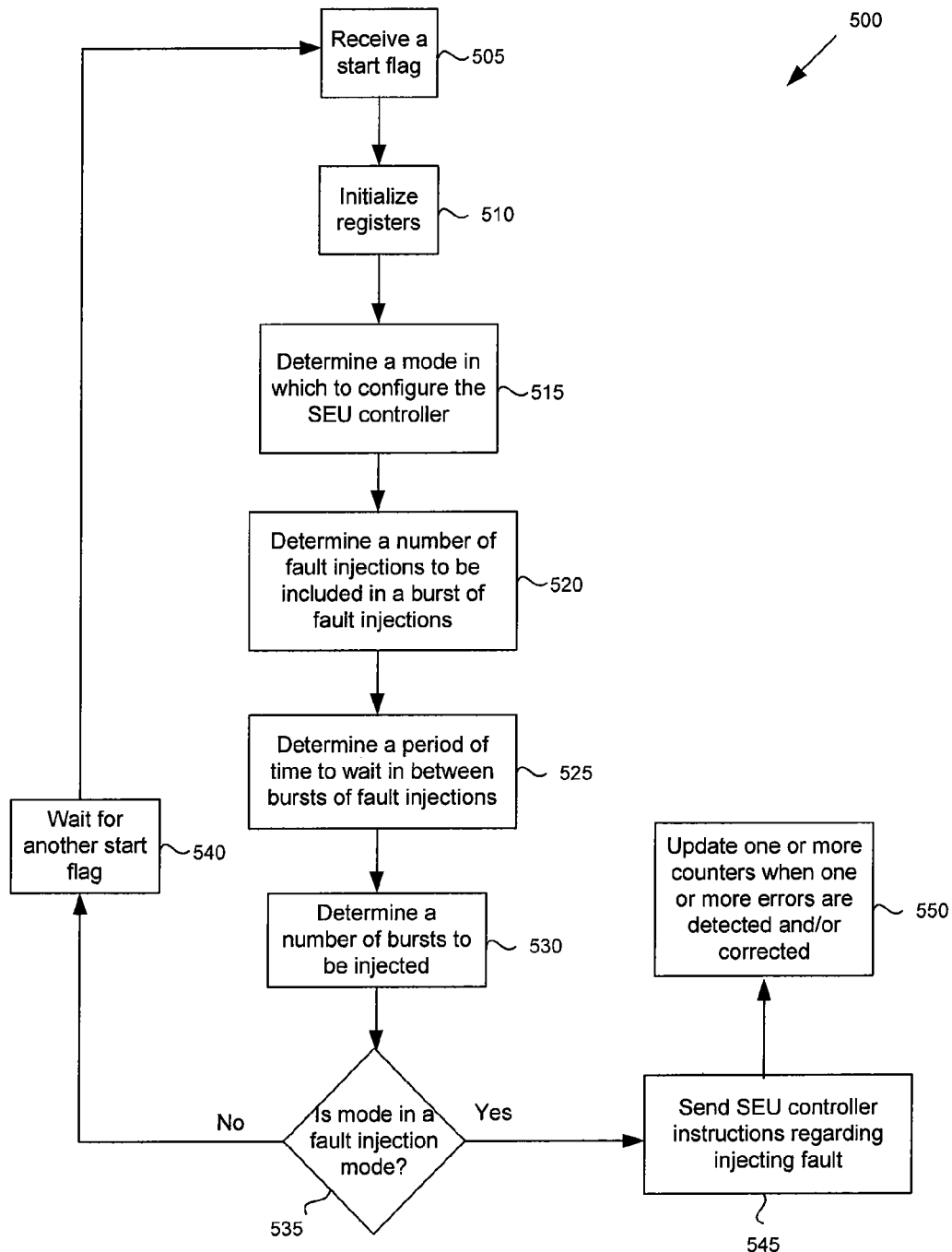
FIG. 5 illustrates an example method for sending an example pattern scheme to a SEU controller to control injections of one or more bursts of faults into memory of an electronic device.

FIG. 5 is flow chart illustrating an example check method 500 used by the system 300 and/or the electronic device 100. At step 505, the SEU wrapper 130 receives a start flag indicating to the SEU controller 110 to exit an idle state and to enter an active state to inject faults. At step 410, the registers, REG_1 to REG_7, are initialized. In one example, initializing the registers includes: storing a value in REG_1 to represent Mode 0, "Detection Only" mode; storing a value in REG_2 to represent that the number of consecutive fault injections in a burst is one; storing a value in REG_3 to represent the number of times the bursts are to be injected to one. Also, the initializing includes setting REG_6 to a value to indicate that no errors have been detected or error injections and/or corrections have been performed. Additionally, the initializing may also include setting a default time period for waiting, such as 10 seconds.

At step 515, the SEU wrapper 130 determines a mode in which the SEU controller 110 is to be configured. The SEU wrapper 130 may determine the mode based on data received from the CPU/IF. The SEU wrapper 130 may store a value indicating the mode in REG_1. At step 520, the SEU wrapper 130 determines a number of consecutive fault injections to be included in a burst of fault injections. The SEU wrapper 130 may determine the number of consecutive fault injections to be included in a burst of fault injections based on data received from the CPU/IF. The SEU wrapper 130 may store a value indicating the number in REG_2. At step 525, the SEU wrapper 130 determines a period of time that the SEU controller 110 is to wait in between injecting bursts of fault injections. The SEU wrapper 130 may determine the period of time based on data received from the CPU/IF. The SEU wrapper 130 may store a value representing the time period in REG_3. At step 530, the SEU wrapper 130 determines a number of times the SEU controller 110 is to inject bursts of fault injections into the electronic device 120. The SEU wrapper 130 may determine the number of times the SEU controller 110 is to inject bursts of fault into the electronic device 120 based on data received from the CPU/IF. The SEU wrapper 130 may store a value representing the number of times in REG_4.

At step 535, the SEU wrapper 130 determines based on the information stored in REG_1 whether the mode in which the SEU controller 110 is to be configured is a fault injection mode, such as Mode 2, 3, 4, or 5. If a value in REG_1 represents that the mode is a detection mode, such as Mode 0 or 1, then at step 540, the SEU wrapper 130 returns to an idle state and waits to receive other instructions at step 540. At step 540, the SEU wrapper 130 does not instruct the SEU controller 110 to inject faults. Alternatively, at step 540, if a value in REG_1 represents that the mode is a fault injection mode, such as Mode 2, 3, 4, or 5, then the method proceeds to step 545. At step 545, the SEU wrapper 130 sends information stored in REG_0, REG_1, REG_2, REG_3, and/or REG_4 to the SEU controller 110, including the mode in which the SEU controller 110 is to be configured, the number of consecutive fault injections to be included in a burst of fault injections, the period of time that the SEU controller 110 is to wait in between injecting bursts of fault injections, and the number of times the SEU controller 110 is to inject bursts of fault injections into the electronic device 120. At step 550, a counter in the SEU wrapper 130 is updated when an error is detected. In addition, a second counter may be updated when an error is corrected. In one example, the SEU wrapper 130 updates one or more counters after receiving information from the SEU wrapper 130 that an error was detected and/or corrected. In another example, the SEU controller 110 updates one or more counters by writing to storage elements storing the one or more counters information indicating that an error was detected and/or corrected. The information may include a value indicating the number of one or more errors were detected and/or corrected.

Figure 6:
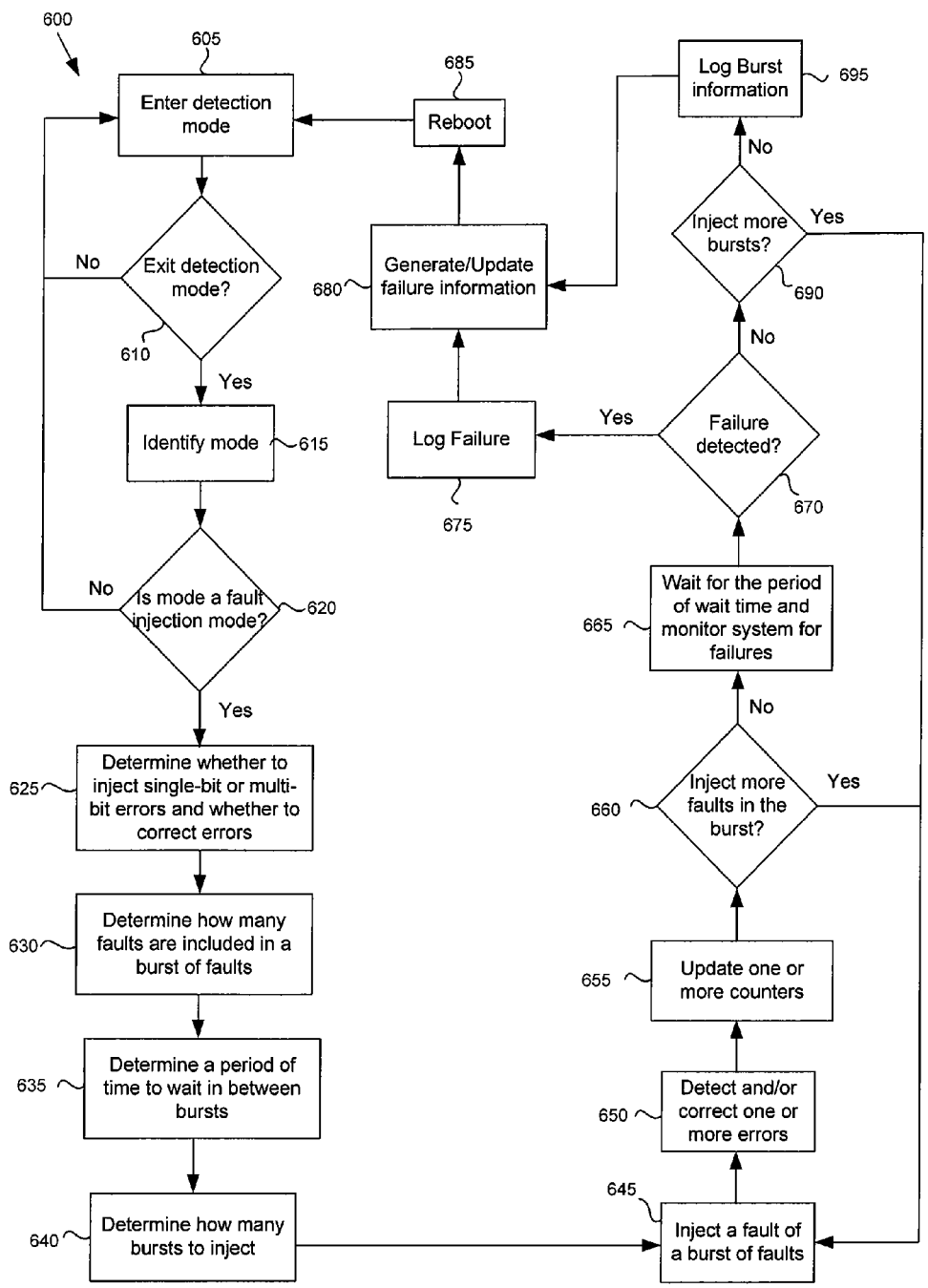
FIG. 6 illustrates an example method of receiving an example pattern scheme from a SEU wrapper to control injections of one or more bursts of faults into memory of an electronic device.

FIG. 6 is flow chart illustrating an example fault injection method 600 used by the system 300 and or the electronic device 100. At step 605, the SEU controller 110 enters a detection mode such as Mode 0 or Mode 1. In the detection mode, the SEU controller waits to receive instructions and/or a pattern scheme. The pattern scheme may be included in the instructions, or the pattern scheme may be determined from the instructions. At step 610, the SEU controller 110 may determine whether to exit an idle state and enter an active state to inject faults. The determination may be based on instructions or a pattern scheme received from the SEU wrapper 130. For example, the instructions received from the SEU wrapper 130 may include a start flag indicating to exit an idle state and/or the detection mode and enter an active state and be configured in a fault injection mode. If the start flag indicates not to exit an idle state, then the method returns to step 605 and the SEU controller 110 remains in the detection mode and waits to receive another set of instructions or pattern scheme from the SEU wrapper 130. At step 610, if the SEU controller 110 determines to exit an idle state and be configured in a fault injection mode, then the method proceeds to step 615. At step 615, the SEU controller 110 identifies the mode in which the SEU controller 110 is to be configured. The mode may be identified based on instructions received by the SEU wrapper 130. At step 620, the SEU controller 110 determines whether the mode is a fault injection mode. If the SEU controller 110 determine that the mode is not a fault injection mode, (i.e., the SEU controller 110 identifies the mode as a detection mode, such as Mode 0 or Mode 1), then the method returns to step 605 and the SEU controller 110 remains idle in the detection mode and waits to receive another set of instructions from the SEU wrapper 130. If at step 620, the SEU controller 110 identifies the mode as a fault injection mode, such as Mode 2, Mode 3, Mode 4, or Mode 5, then the method proceeds to step 625. At step 625, the SEU controller 110 determines whether a single-bit error or a multi-bit error is to be injected based on the identified mode. Also, at step 625, the SEU controller 110 determines whether detected recoverable errors will be corrected, or whether faults will be injected only based on the identified mode.

At step 630, the SEU controller 110 determines how many faults are included in a burst of faults. The number of faults may be determined based on instructions received by the SEU wrapper 130. At step 630, the SEU controller 110 may store an index value (e.g., num_injection index value) as the number of faults included in a burst of faults. At step 635, the SEU controller 110 determines a period of time to wait in between bursts. The period of time may be determined based on instructions received by the SEU wrapper 130. At step 640, the SEU controller 110 determines the number of bursts to be injected. In one example, at step 640, the SEU controller 110 may store a second index value (e.g., num_sys_index value) as the number of bursts of fault injections. Other fault pattern control schemes may be used, such as selecting from one of a plurality of predetermined patterns.

At step 645, the SEU controller 110 injects a fault injection of a burst of fault injections into the memory of the electronic device 120. At step 650, the SEU controller 110 detects one or more errors. Also, at step 650, if the SEU controller 110 is in an error correction mode, such as Mode 2 or 3, the SEU controller 110 determines whether the error is a correctable error. If the SEU controller 110 is in Mode 2 or 3 and the error is a correctable error, then the error is corrected. At step 655, one or more counters are updated when an error is detected and/or corrected. In one example, the SEU controller 110 sends information regarding detected and/or corrected errors to the SEU wrapper 130 and the SEU wrapper 130 updates the one or more counters based on the information received from the SEU controller 110. In another example, the SEU controller 110 writes information to one or more counters using the information that one or more errors were detected and/or corrected. At step 660, the SEU controller 110 determines whether to inject another fault of the burst of faults. The determination may be based on the pattern scheme, such as whether all of the faults in the burst have been injected. The SEU controller 110 may determine whether all of the faults have been injected by decrementing the num_injection index value by an amount representing one fault injection. If decrementing the num_injection index value yields a value of zero, then all of the faults in a burst are injected. If all of the faults in a burst have not been injected, then another fault is injected. Little to no time elapses between the SEU controller 110 detecting and/or correcting an error and injecting another fault if the SEU controller 110 determines that not all of the faults in a burst have been injected.

If all of the faults in a burst have been injected, then the method proceeds to step 665. At step 665, the SEU controller 110 waits for the period of time. During step 665, the electronic device 100 and/or the system 300 monitors for failures to determine the response of the electronic device 100 and/or the system 300 to the one or more faults in the burst of injections on the performance of the system. At step 670, the system 300 and/or the electronic device 100 determines whether a failure in the system or the electronic device was detected. If a failure was detected, then at step 675 the failure is logged. At step 680, information regarding the failure of the system 300 and/or the electronic device 100 is generated or updated. The information may include statistics based on the fault injections and the failures. The information may indicate correlations between failures that the system 300 may encounter in the field. The information may include failures that may be linked to an SEU. The information may include statistics, such as the percentage of injected faults that yield recoverable errors, unrecoverable (i.e., fatal) errors, silent errors (e.g., the system 300 sustained traffic loss while no other error was detected), and silent crashes (e.g., the system 300 crashed without any errors being logged by the system 300). At step 685, the system 300 reboots and the system enters a detection mode at step 605.

Referring back to step 670, if the system 300 and/or the electronic device 100 did not detect a failure, then the SEU controller 110 determines whether to inject more bursts at step 690. The SEU controller 110 may make the determination based on whether all of the bursts have been injected. In one example, the SEU controller 110 decrements the num_sys_test index value by an amount representing one burst. The SEU controller 110 then determines whether the decremented num_sys_test index value is zero. If the decremented index value is zero, then all of the bursts have been injected. If the decremented value is greater than zero, then all of the bursts have not been injected.

If all of the bursts have been injected, then the method proceeds to step 695. At step 695, information regarding the bursts of fault is logged. The information may include the number of bursts of fault injections that were injected, the total number of faults that were injected, the number of corrupted memory elements that were detected, and/or the number of corrupted memory elements that were corrected. The SEU controller 110 exits the fault injection mode, such as Mode 2, Mode 3, Mode 4, or Mode 5, and enters a detection mode, such as Mode 0 or Mode 1, and waits to receive another set of instructions from the SEU wrapper 130. If all of the bursts have not been injected, then the method returns to step 645 and injects a fault of another burst of faults.

Referring back to FIG. 3, an example of the system 300 of FIG. 3 may be a cable modem termination system (CMTS). CMTS is an electronic system that is used to provide high speed data services, such as cable, internet, or VoIP to subscribers. In order to provide the high speed data services, a cable company sends the high speed data over the internet to a network service provider. The CMTS enables communication of the high speed data with a subscriber's cable modem. A single CMTS may service tens, hundreds, or thousands of individual cable modems. A CMTS may have several line cards, where each line card is in communication with one or more cable modems. A CMTS may send upstream data or network traffic from the cable modems to the cable company over the Internet or an intranet, or send downstream data or network traffic from the cable company over the Internet or intranet to the individual cable modem. The CMTS may include an electronic device, such as an FPGA, in addition to other circuitry that processes the network traffic. An error in one of the memory elements of the FPGA, such as a soft error caused by a SEU, may not affect the performance of the CMTS, may cause a recoverable error without the line card having to shut down, may cause an unrecoverable error with the line card having to shut down, may cause traffic loss while no other error was detected, or may cause an unknown line card crash without any errors being logged. Monitoring circuitry in the CMTS may detect a system failure when faults are being injected into memory of chips or integrated circuits in the CMTS. The CMTS may be sending and/or receiving traffic flow while an SEU controller on a chip or integrated circuit in the CMTS is injecting fault into memory of the chip or integrated circuit. The response of the CMTS to the fault injections, such as the performance and/or behavior while being subjected to faults, may be monitored or evaluated while the CMTS is in an operation mode.

In the CMTS, a SEU controller 110 and a SEU wrapper 130 may be implemented in a chip or integrated circuit in the CMTS to emulate a SEU event. The SEU wrapper 130 may control the fault injections performed by the SEU controller 110. The SEU controller 110 may detect and/or correct the errors generated by the fault injections. The detections and/or corrections of the errors may be obtained as statistical information. For example, the information may be used to measure the percent of injected faults that can cause recoverable, unrecoverable, and silent errors for the FPGA and/or the CMTS. The information may also be used to estimate a failure rate of the FPGA and/or the CMTS that uses the FPGA. The information may be used to correlate the failure caused by fault injections with failures that may be encountered out in the field, such as a SEU caused by an alpha particle or a neutron.

The method described in conjunction with the SEU controller 110 and the SEU wrapper 130 may be implemented as part of the FPGA design. The design may be executed by the FPGA to inject faults into configuration memory of the FPGA and to control when, how often, and/or how many times the fault is to be injected without having to rest the FPGA and/or the entire CMTS. The fault injections may be performed while the CMTS is carrying the network traffic.

The electronic device 100 may be a dedicated hardware implementation, such as application specific integrated circuits, programmable logic arrays and other hardware devices, that may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system may encompass software, firmware, and hardware implementations. Alternatively or in addition, the methods described herein may be implemented by software programs executable by the system 100. The SEU controller 110 and the SEU wrapper 130 may each be a computer-readable medium that includes instructions and/or receives and executes instructions responsive to a propagating signal.

Various embodiments described herein can be used alone or in combination with one another. The foregoing detailed description has described only a few of the many possible implementations of the present invention. For this reason, this detailed description is intended by way of illustration, and not by way of limitation.

What is claimed is:
1. A method comprising:
  entering an operation mode on an electronic system, the electronic system configured
  to receive and route packets in the operation mode, wherein the electronic system comprises an integrated circuit that comprises reconfigurable logic circuitry to perform a function of the integrated circuit and a configuration memory that configures the reconfigurable logic circuitry;
  injecting, with a controller circuit, one or more faults into the configuration memory of the integrated circuit; and monitoring, with monitoring circuitry, the electronic system for failures while packets are received and routed by the electronic system in the operation mode and the configuration memory is subjected to the one or more faults, wherein the integrated circuit comprises a field programmable gate array, wherein the reconfigurable logic circuitry comprises a plurality of reconfigurable logic blocks each configured to perform a logic function, and wherein the configuration memory configures the plurality of reconfigurable logic blocks.

2. The method of claim 1, wherein injecting the one or more faults into the configuration memory comprises injecting, with the controller circuit, the one or more faults into the configuration memory in accordance with a pattern scheme, and wherein the pattern scheme comprises:
a rate of fault injection; and
a time period for injecting faults.

3. The method of claim 1, wherein injecting the one or more faults into the configuration memory comprises injecting, with the controller circuit, the one or more faults into the configuration memory in accordance with a pattern scheme that identifies the one or more faults to be injected as one or more bursts of one or more faults.

4. The method of claim 3, wherein the one or more bursts of one or more faults comprises one or more bursts of a plurality of faults, and
wherein for each burst of the one or more bursts, injecting the burst comprises consecutively injecting the plurality of faults.

5. The method of claim 1, further comprising:
detecting, with the controller circuit, at least one error in the configuration memory after each injection of the one or more faults; and
updating, with the controller circuit, a register in the integrated circuit to indicate the detection of the at least one error.

6. The method of claim 2, wherein the rate of fault injection comprises a burst of one or more faults per a period of wait time,
wherein monitoring the electronic system for failures comprises monitoring, with the monitoring circuitry, the electronic system for failures during the period of wait time.

7. The method of claim 1, further comprising:
generating, with a processor circuit, a system response of the electronic system in response to monitoring the electronic system for failures while packets are received and routed by the electronic system in the operation mode, the system response identifying a routing performance of the electronic system in the operation mode when the configuration memory is subjected to the one or more faults.

8. The method of claim 7, wherein the system response comprises at least one of: types of failures, the types of failures comprising fatal errors and non-fatal errors; failure rates associated with the types of failures; single event upset (SEU)-related failure symptoms; areas in the system that are sensitive to SEU events; areas that require SEU protection, or validations of SEU-resilient system designs.

9. A system comprising:
an integrated circuit comprising:
a reconfigurable logic circuit configured to perform a function;
a configuration memory configured to store data that configures the reconfigurable logic circuit; and
a controller circuit configured to:
inject one or more faults into the configuration memory; and
monitoring circuitry configured to monitor the system for failures while the system receives and routes packets of information in an operation mode and the configuration memory is subjected to the one or more faults,
wherein the integrated circuit comprises a field programmable gate array, wherein the reconfigurable logic circuitry comprises a plurality of reconfigurable logic blocks each configured to perform a logic function, and wherein the configuration memory configures the plurality of reconfigurable logic blocks.

10. The system of claim 9, wherein the controller circuit is configured to inject the one or more faults into the configuration memory according to a pattern scheme that includes:
a rate of fault injection; and
a period for injecting faults.

11. The system of claim 9, wherein the controller circuit is configured to inject the one or more faults into the configuration memory according to a pattern scheme that identifies the one or more faults to be injected as one or more bursts, each burst comprising a plurality of faults, and
wherein for each burst the controller circuit is configured to consecutively inject the plurality of faults.

12. The system of claim 9, wherein the controller circuit is further configured to:
detect at least one error in the configuration memory resulting from injection of the one or more faults; and
update a register in the integrated circuit to indicate the detection of the at least one error.

13. The system of claim 10, wherein the rate of fault injection comprises a burst of one or more faults per a period of wait time,
wherein the monitoring circuitry is configured to monitor the system for failures during the period of wait time.

14. The system of claim 9, wherein the monitoring circuitry is further configured to:
detect a failure of the system; and
send information about the failure to a processor for generation of a system response based on the failure and the injection of the one or more faults.

15. The system of claim 9, wherein the integrated circuit comprises a first integrated circuit, the system further comprising:
a second integrated circuit,
wherein the second integrated circuit comprises the monitoring circuitry.

16. The system of claim 9, further comprising:
a processor circuit configured to generate a system response of the system in response to the monitoring of the system for failures while the system receives and routes the packets in the operation mode, the system response identifying a routing performance of the system in the operation mode when the configuration memory is subjected to the one or more faults.

17. One or more non-transitory computer readable storage media encoded with software comprising computer instructions executable by a processor, the instructions comprising:
instructions to enter an operation mode on an electronic system, the electronic system configured to receive and route packets in the operation mode, the system comprising an integrated circuit having reconfigurable logic circuitry to perform a function of the integrated circuit and a configuration memory that configures the reconfigurable logic circuitry;
instructions to inject one or more faults into the configuration memory of the integrated circuit; and instructions to identify failures of the system while the electronic system receives and routes the packets in the operation mode and the configuration memory is subjected to the one or more faults, wherein the integrated circuit comprises a field programmable gate array, wherein the reconfigurable logic circuitry comprises a plurality of reconfigurable logic blocks each configured to perform a logic function, and wherein the configuration memory configures the plurality of reconfigurable logic blocks.

18. The one or more non-transitory computer readable storage media of claim 17, wherein the instructions to inject the one or more faults into the configuration memory comprises instructions to inject the one or more faults into the configuration memory according to a pattern scheme that comprises:
   a rate of fault injection, the rate comprising a burst of one or more fault injections per a period of wait time, the burst comprising a plurality of fault injections; and
   a period of time for injecting faults.

19. The one or more non-transitory computer readable storage media of claim 18, the instructions further comprising instructions to monitor the electronic system for failures during the period of wait time.

20. The one or more non-transitory computer readable storage media of claim 17, the instructions further comprising:
   instructions to detect at least one error in the configuration memory resulting from injection of the one or more faults;
   instructions to update a first register in the integrated circuit to indicate the detection of the at least one error;
   instructions to correct the at least one error in the configuration memory; and
   instructions to update a second register in the integrated circuit to indicate the correction of the at least one error.

21. The one or more non-transitory computer readable storage media of claim 17, the instructions further comprising:
   instructions to detect a failure of the electronic system; and
   instructions to send information about the failure to a processor for generation of a system response.

22. The one or more non-transitory computer readable storage media of claim 17, the instructions further comprising instructions to generate a system response that identifies a routing performance of the electronic system based on the identified failures when the configuration memory is subjected to the one or more faults.

23. A system comprising:
   an integrated circuit comprising:
      a logic circuit configured to perform a function;
      a memory configured to store data that determines a function of the logic circuit; and
      a controller circuit configured to:
         inject one or more faults into the memory according to a pattern scheme for injecting the one or more faults,
   wherein the pattern scheme comprises:
      a first value indicating a number of one or more consecutively injected faults that are included in one or more bursts of fault injections;
      a period of time to wait; and
      a second value that indicates a number of one or more bursts to be injected; and
   monitoring circuitry configured to monitor the system for failures while the system receives and routes packets of information in an operation mode and the memory is subjected to the one or more faults.

* * * * *